United States Patent [19]

Yoshisato

[11] Patent Number: 4,556,988

[45] Date of Patent: Dec. 3, 1985

[54] INDOOR UNIT OF RECEIVER FOR BROADCASTING SATELLITE

[75] Inventor: Akiyuki Yoshisato, Soma, Japan

[73] Assignee: Alps. Electric Co., Ltd., Japan

[21] Appl. No.: 536,355

[22] Filed: Sep. 27, 1983

[30] Foreign Application Priority Data

Sep. 27, 1982 [JP] Japan ............................ 57-167873

[51] Int. Cl.⁴ .............................................. H04B 1/26
[52] U.S. Cl. ...................................... 455/182; 455/183; 455/192; 455/260; 455/208; 455/302
[58] Field of Search ............... 455/131, 182, 183, 189, 455/192, 207, 208, 209, 214, 260, 263, 314–316, 302; 329/122; 331/22; 358/188, 195.1

[56] References Cited

U.S. PATENT DOCUMENTS

| | | | |
|---|---|---|---|
| 3,346,814 | 10/1967 | Haggai | 455/260 |
| 4,038,689 | 7/1977 | Rzeszewski et al. | 455/182 |
| 4,087,756 | 5/1978 | Rogers, Jr. | 455/208 |
| 4,237,556 | 12/1980 | Naito | 455/208 |
| 4,417,279 | 11/1983 | Shinkawa et al. | 358/195.1 |
| 4,472,685 | 9/1984 | Dutasta | 329/122 |

OTHER PUBLICATIONS

"A 12-GHz Low-Cost Earth Terminal for Direct TV Reception from Broadcast Satellites" by Rene J. Douville 12/1977.

"Integration Simplfies TVRO Design" by Fornaciari, 3/1981.

"Low-Noise 12 GHz Front-End Designs for Direct Satellite Television Reception" by Harrop et al, 1980.

Primary Examiner—Jin F. Ng
Attorney, Agent, or Firm—Guy W. Shoup

[57] ABSTRACT

Improved AFC performance is achieved in a satellite dish receiver by using an indoor unit having a first intermediate frequency (IF signal) which does not include an image frequency and by using a PLL-demodulator for controlling the AFC loop.

3 Claims, 2 Drawing Figures

INDOOR UNIT OF RECEIVER FOR BROADCASTING SATELLITE

FIELD OF THE INVENTION

This invention relates to an SHF receiver for receiving radio waves transmitted from a broadcasting satellite, and more specifically to an indoor unit for processing the first intermediate frequency signal obtained by frequency-converting the received signal therefrom, designed as a single superheterodyne receiver having the second intermediate frequency which is sufficiently higher than the existing final intermediate frequency.

BACKGROUND OF THE INVENTION

In general, a radio wave transmitted from a broadcasting satellite and received by a parabolic antenna, for example, a signal in frequency of 11.7~12.2 GHz is once group-converted into the first intermediate frequency signal of 950~1450 MHz by the low noise convertor LNC provided in the premises just under antenna and then supplied to an indoor unit through coaxial cable. An indoor unit selects the frequency of specific station from the first intermediate frequency signal supplied from LNC, then amaplifies and demodulates the VIDEO and AUDIO signals.

In such a receiving system of indoor unit, the final intermediate frequency is usually set to a frequency considerably lower than the receiving frequency, for example, to a frequency as low as 70 MHz. However, in this case, following problems remain unsolved.

1. In case the intermediate frequency to be input to the demodulator is only about 70 MHz in the single or double superheterodyne system, the specific bandwidth becomes broad in the PLL demodulation system, a simple VCO using only one variable capacitance diode cannot provide sufficient linearity and therefore an more expensive VCO assuring advanced linearity must be used.

2. When a demodulating system different from the PLL demodulating system is employed in above item 1, the intermediate frquency signal is partly used for AFC. In this case, since the C/N(carrier/random noise ratio) threshold extension effect is not applied on the signal, if C/N is bad, the AFC may operate errorneously.

3. In case the intermediate frequency is selected to 70 MHz, for example, in the single superheterodyne system, an image frqeuency is within the bandwidth of input signal, it is required to use the image rejection type mixer or to insert an RF tuning circuit which operates in conjunction with a channel selector before the mixer.

SUMMARY OF THE INVENTION

It is an object of the present invention to solve the abovementioned problems of the existing indoor unit of receiver for broadcasting satellite and therefore such indoor unit is configurated as the single superheterodyne system, the intermediate frequency thereof is sufficiently higher frequency so that the image frequency is out of the bandwidth of input signal, and the PLL demodulator is used in order to generate an AFC control signal having a high C/N. The present invention is, moreover, characterized in that:

1' structure is simplied because of employment of the single superheterodine system as compared with that in the double superheterodyne system and in addition, there is no spurious interferences which are generated by a pair of local oscillators, 2' the intermediate frequency is set, for example, as high as about 600 MHz for the input signal bandwidth of 950 1450 MHz and thereby an image frequency cannot enter the input signal bandwidth and accordingly the mixer is not required to employ the image rejection type and thereby simplified, 3' an AFC signal having high C/N threshold extension effect can be obtained using a part of output signal of the VCO forming the PLL demodulator.

BRIEF DESCRIPTION OF THE DRAWINGS

In the drawings incorporated to the present invention.

DETAILED DESCRIPTION OF THE INVENTION

Figure 1:
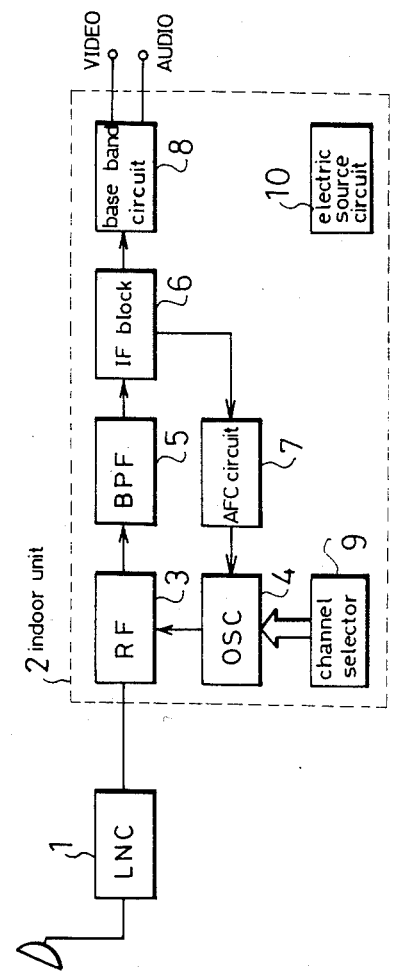
FIG. 1 is outline of structure of the preferred embodiment of the present invention.

Prior to detail explanation of the present invention, the above features of the present invention will be described in more detail hereunder.

In case an input frequency has the bandwidth of 500 MHz in the range of 950~1450 MHz, an image frqeuency can be placed out of the input frequency bandwidth by selecting the intermediate frequency to 250 MHz or higher. If an image signal enters the bandwidth, for example, of 70 MHz band because the intermediate frequency is lowered in the existing system utilizing a cheap mixer, there is no way other than attenuating such image signal frequency by inserting a variable RF tuning circuit which is capable of tracking a local oscillation frequency into the RF stage or using an expensive image rejection mixer system. Moreover, even when an image rejection mixer is used, it does not provide sufficient performance as the image frequency attenuation degree and further a local oscillation signal must have a higher signal level than that of an ordinary mixer, increasing cost of OSC block. Accordingly, when the intermediate frequency is selected to 250 MHz or higher, the mixer can be simplified and cost can also be reduced.

Here, an intermediate frequency is discussed from the point of view of PLL-FM demodulation. Since frequency shift of intermediate frequency signal is constant without relation to the intermediate frequency, when an intermediate frequency is low, the specific bandwidth becomes broad and a VCO having goopd linearity is required. For this reason, a VCO for PLL must be designed utilizing an expensive special cariable capacitance diode or a voltage controlled multivibrator by ECL. On the other hand, when an intermediate frequency is selected high, if a VCO is designed by combining a general purpose variable capacitance diode into the λ/2 type strip line system similar to the oscillator of UHF tuner, sufficient linearity can be obtained since the specific bandwith is narrow and thereby an economical PLL-FM demodualtor can be designed.

The, an intermediate frequency is considered, in turn, from the point of view of IF amplifier. When an intermediate frequency is lower, a higher gain can be obtained and operation is also highly stabilized. But, currently, a sufficient gain and operation stability can be ensured even in the case of the single superheterodyne system using an intermediate frqeuency of 600 MHz, owing to that the low price high performance transistor for 1 GHz or lower can be obtained on account of recent progress in semiconductor technology, in addition, an amplifier can be designed with the circuit structure of macri-strip line system and the structure can be divided using a shield or frame.

Concerning linearity of of VCO for PLL-FM demodulation, a VCO consisting of the λ/2 type oscillator and general purpose variable capacitance diode is capable of providing sufficient linearity at the frequency of 600 MHz even if the center frequency is not raised up to 1 GHz or higher and therefore a cheap PLL-FM demodulator can be obtained.

From above explanation, it can be easily understood that the single superheterodyne system using a high intermediate frquency is more excellent in the performance and cost than the double superheterodyne system or the single superheterodyne system using a low intermediate frequency, so long as sufficient operation stability is guaranteed.

The upper limit of the optimum intermediate frequency in the single superheterodyne system is currently considered to be 900 MHz judging from a cost of IF amplifier, stability of operation and that a cheap semiconductor device for UHF tuner can be obtained. While, the lower limit is determined by the image frequency and linearity of VCO for PLL-FM demodulation and is considered to be 300 MHz or higher. Therefore, an actual intermediate frequency is selected to that within the range of 300~900 MHz and does not allow generation of beats or spriouses and is set to 600 MHz in this explanation. For example, it is also selected to 600 MHz in the embodiment explained later.

Concerning the AFC, a signal of VCO is used as the signal for detecting a shift of IF signal and a signal in good C/N can be obtained by using PLL system for FM demodulation. The obtained signal is divided by the prescaler and the AFC control voltage can be generated using the general purpose FM detecting IC and thereby mis-operation of AFC can be lessened even when the C/N of RF signal is bad.

In addition, a cheap and highly sensible IC to be used for AFC can be obtaineded and therefore a prescaler output signal can be attenuated by ATT and connected at a low level. Accordingly, harmonic interference of the prescaler output signal can be lessened. Further, if temperature compensation is carried out considering fluctuation by temperature of coil and capacitor in the quadrature detector stage, sufficient AFC standard such as about 1/2000 can be obtained at a temperature range of $-10°$ C. ~ $+50°$ C. Since said IC provides the limiter function and therefore it assures sufficient stability even for level fluctuation of VCO or prescaler.

Then, concerning the RF structure, sufficiently stable operation can be obtained even in the single superheterodyne system with an intermediate frqeuency of 600 MHz by dividing the RF structure at least into the three blocks of the RF block, IF block and OSC block.

Here, the device of the present invention is then described in detail by way of a first embodiment thereof with reference to the drawings attached.

Figure 2:
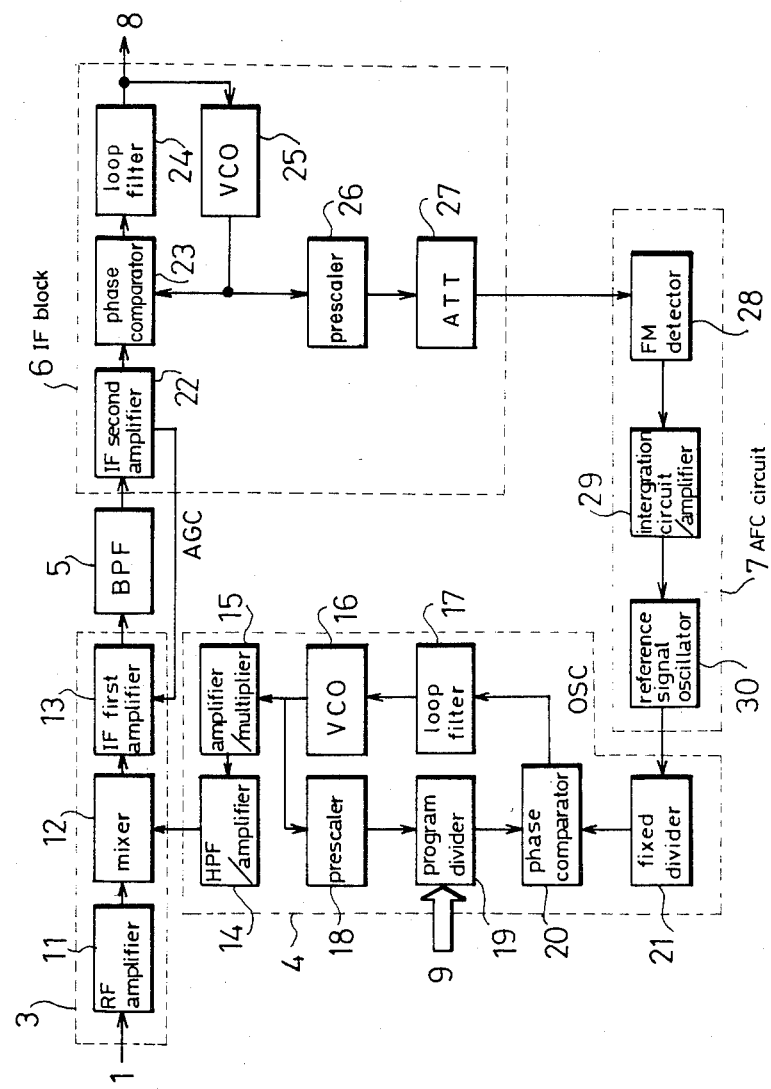
FIG. 2 is a detail structure of major part of indoor unit.

FIG. 1 is the block diagram of the embodiment incorporated to the present invention. FIG. 2 is a detail block diagram of the major part thereof.

LNC(1) is a now noise convertor to be set just under the parabolic antenna. For example, a signal of 11.7 12.2 GHz is group-converted into the signal of 950~1450 MHz and is then supplied to the indoor unit through a coaxial cable. Here, LNC(1) is called an outdoor unit.

An indoor unit (2) receives selectively an output signal of LNC(1) and demodulates the VIDEO signal and AUDIO signal. The indoor unit (2) also comprises an RF output of TV modulator (not shown) called a "MODULATOR" provided in order to connect such demodulated signal to a home television receiver.

The RF block (3) converts an input signal, namely the LNC output signal of 950~1450 MHz into an IF frequency and is composed of the RF amplifier (11), mixer (12) and IF first amplifier (13) as shwon in FIG. 2. Moreover, the loop through circuit (for example, 10 dB direction coupler etc.) and the BPF circuit of input frequency (not shown) are inserted at the input side of RF amplifier (11) so that it can also be connected to other indoor unit. In addition, the IF first amplifier (13) includes a variable attenuation circuit which is controlled by the AGC voltage explained later and allows the AGC operaton as a receiver. The IF first amplifier (13) consists of an amplifier which succeeded in making less as much as possible the fluctuation of impedance by connecting a resistance attenuator to both input and output circuits.

An output IF signal of the RF block (3) is input to the BPF (5) and then input to the IF block (6) after cutting other signals unwanted for demodulation and noises. This IF block is composed of the circuit which amplifies an IF signal and then FM modulates it and the IF frequency divider which performs AFC operation explained later.

The IF second amplifier (22) has the function to amplify an IF signal up to a level required as the input signal of the PLL-FM democulator consisting of (23), (24) and (25) and to generated an AGC control voltage by detecting and amplifying a part of the output signal of amplifier and to feed back it to the variable attenuator of said IF first amplifier (13).

An output signal in a constant level of the IF second amplifier (22) is input to the PLL-FM demodulator consisting of the phase comparator (23), loop filter (24) and VCO (25).

Here, the PLL-FM demodulator demodulates a base band signal by the C/N threshold extension effect, sends the signal to the base band circuit (8), processes the signal with the video amplifier circuit, deemphasis circuit, clamp circuit, AUDIO-SUB carrier demodulator circuit, AUDIO amplifier etc. not shown and then outputs the VIDEO signal and AUDIO signal.

The principle of the C/N threshold extension effect of the PLL-FM demodulator is described in the references and therefore not explained here. (see Atai et al U.S. Pat. No. 4,293,945.)

An output signal of VCO (25) is in the bandwidth determined by the loop filter (24) while the IF signal has at least the necessary bandwidth according to the Carson bandwidth rule under the condition that it is tracking to the IF signal of the second IF amplifier (22), and the bandwidth can be designed narrower than that determined by the Carson bandwidth rule as much as an FM frequency shift. Thereby, an output signal of VCO (25) is much improved in the C/N than the IF signal, as is well known.

Thus, as the signal for AFC, a part of the output signal of VCO of which C/N has been improved is input to the prescaler (26), and it is divided therein into the frequency on which the IC for FM detector operates and its output is attenuated up the operating level required by said IC by the ATT circuit (27) and then input to the IC. The ATT circuit (27) inserted provides a merit that influence on the other circuit of the high frequency component of the prescaler output is prevented on the occasion of conecting the output signal of prescaler (26) to the IC in the other block and it is possible when an IC has a high sensitivity.

The OSC block (4) generates a local oscillation signal to be sent to the mixer (12) of the RF block (3) and is composed of the PLL frequency synthesizer and frequency doubler. When the input signal frequency ranges from 950 to 1450 MHz with an IF of 600 MHz, the local oscillation signal frequency is ranged from 1550 to 2050 MHz. When the frequency of VCO (16) is in the range 775~1025 MHz which is a half of above local oscillation frequency, the prescaler (18) operates within this range.

The PLL frequency synthesizer is composed of the VCO (16), prescaler (18), program divider (19), phase comparator (20), loop filter (17), fixed divider (21) and reference signal oscillator (30) described later. Channel selection is carried out by changing the dividing ratio of program divider (19) with a digital signala of the channel selector (9). The AFC is a function to prevent deviation of IF frequency due to deviation of the input signal frequency etc. and is used for compensation of drift of local oscillation frequency of LNC(1) and compensation of frequency in such a case where the wanted local oscillation frequency is deviated by several MHz because of insufficient number of variable bits of the program divider (19).

An output of VCO(16) is amplified and doubled in frequency by the amplifier/multiplier. A high pass-filter of the HPF/amplifier (14) attenuates the oscillation frequency itself of VCO, allows the wanted doubled signal to pass and moreover generates the local oscillation signal by amplifying it.

(7) is an AFC circuit and an output signal of ATT (27) is input to the FM detector (28). The FM detector (28) is a general purpose IC known as the IC for FM demodulation of 10.7 MHz, and the monolithic linear IC's such as upc 1167C, LA1231N of the quadrature detection system are available. These IC's have high sensitivity with limiter function and cheap. An AFC output signal of this IC is integrated and amplified by the integration circuit/amplifier (29) using an operational amplifier. Thereby, a DC AFC control voltage can be obtaioned. This AFC control voltage is fed back to the reference signal oscillator (30).

According to the present invention, the structure is simple as compared with the existing device, resulting in less image and spurious. Moreover, an indoor unit of receiver for broadcasting satellite ensuring very stable operation and low cost can be obtained.

What is claimed is:

1. An indoor unit of a receiver which receives radio waves transmitted from a broadcasting satellite and group-converts the received radio waves into a first intermediate frequency signal which is then fed to said indoor unit for conversion into a second intermediate frequency signal; the indoor unit having a single superheterodyne structure comprising:
   a mixer for converting the first IF signal into the second IF signal;
   a first VCO coupled to and driving the mixer;
   an IF amplifier for coupling the second IF signal out from the mixer;
   a PLL demodulator having a phase comparator, a loop filter and a second VCO, wherein a first portion of the VCO output is coupled to the phase comparator, and the input of said PLL demodulator is coupled to the IF amplifier output; and an AFC circuit coupled to a second portion of the output of said second VCO and generating a control signal for controlling the frequency of the first VCO;
   wherein the frequency of said second IF signal is selected sufficiently high so that an image frequency thereof is not included within the receiving range of the IF amplifier and a prescaler for dividing the second portion of the output of said second VCO, the prescaler being interposed between the output of the second VCO and the AFC circuit and supplying a divided-down signal to said AFC circuit.

2. An indoor unit of claim 1 wherein said AFC circuit comprises an FM detector, an integration circuit/amplifier coupled to the FM detector, and a reference signal oscillator coupled to the integration circuit/amplifier.

3. An indoor unit of a receiver which receives radio waves transmitted from a broadcasting satellite and group-converts the received radio waves into a first intermediate frequency signal which is then fed to said indoor unit for conversion into a second intermediate frequency signal; the indoor unit having a single superheterodyne structure comprising:
   a mixer for converting the first IF signal into the second IF signal;
   a first VCO coupled to and driving the mixer;
   an IF amplifier for coupling the second IF signal out from the mixer;
   a PLL demodulator having a second VCO, where the input of said PLL demodulator is coupled to the IF amplifier output; and an AFC circuit coupled to the output of said second VCO and generating a control signal for controlling the frequency of the first VCO;
   wherein the frequency of said second IF signal is selected sufficiently high so that an image frequency thereof is not included within the receiving range of the IF amplifier; the indoor unit further comprising a prescaler for dividing the output of said second VCO, the prescaler being interposed between the output of the second VCO and the AFC circuit and supplying a divided-down signal to said AFC circuit through an attenuator.

* * * * *